United States Patent [19]
Tsunoda

[11] Patent Number: 5,384,683
[45] Date of Patent: Jan. 24, 1995

[54] INTELLIGENT POWER DEVICE MODULE

[75] Inventor: Tetsujiro Tsunoda, Fujisawa, Japan

[73] Assignee: Kabushiki Kaisha Toshiba, Kawasaki, Japan

[21] Appl. No.: 972,310

[22] Filed: Nov. 5, 1992

[30] Foreign Application Priority Data

Nov. 7, 1991 [JP] Japan .................. 3-318550

[51] Int. Cl.$^6$ .................. H01G 4/02; H01G 4/06
[52] U.S. Cl. .................. 361/313; 361/328; 361/326; 361/707; 361/734; 174/255; 174/260
[58] Field of Search .............. 361/311, 312, 313, 306, 361/397, 400, 424, 306.1, 746, 734, 792, 794, 704, 707, 720, 328, 326, 330; 174/252, 255, 260

[56] References Cited

U.S. PATENT DOCUMENTS

| | | | |
|---|---|---|---|
| 4,172,261 | 10/1979 | Tsuzuki et al. | 257/717 |
| 4,349,862 | 9/1982 | Bajorek et al. | 361/762 |
| 4,893,215 | 1/1990 | Urushiwara et al. | 361/739 |
| 5,043,533 | 8/1991 | Spielberger | 361/306 |
| 5,134,539 | 7/1992 | Tuckerman et al. | 361/311 |
| 5,196,990 | 3/1993 | Kurosaki | 361/720 |

Primary Examiner—Philip H. Leung
Assistant Examiner—Gregory L. Mills
Attorney, Agent, or Firm—Oblon, Spivak, McClelland, Maier & Neustadt

[57] ABSTRACT

In a semiconductor device module of this invention, on a metal base is formed a metal layer, on which an insulating substrate is formed. On the insulating substrate is formed conducting film patterns, to which a power device and a control device for controlling the power device are electrically connected. The metal layer exists only between the insulating substrate and the base under the power device, whereas a space is provided between the insulating substrate and the base under the control device, and is filled with air.

19 Claims, 8 Drawing Sheets

INTELLIGENT POWER DEVICE MODULE

BACKGROUND OF THE INVENTION

1. Field of the Invention

This invention relates to an intelligent power device module that has a power device chip and a control device chip for controlling the power device chip put on a single mounting board substrate.

2. Description of the Related Art

In this specification, a semiconductor device module that has a power device chip and a control device chip put on a single mounting board is called an intelligent power device module.

Figure 1A:
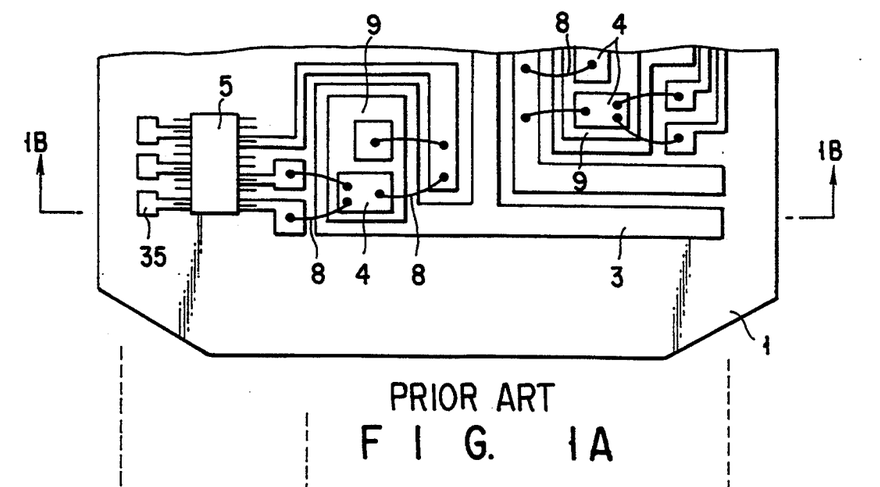
FIG. 1A is a plan view of a conventional semiconductor device module.
Figure 1B:
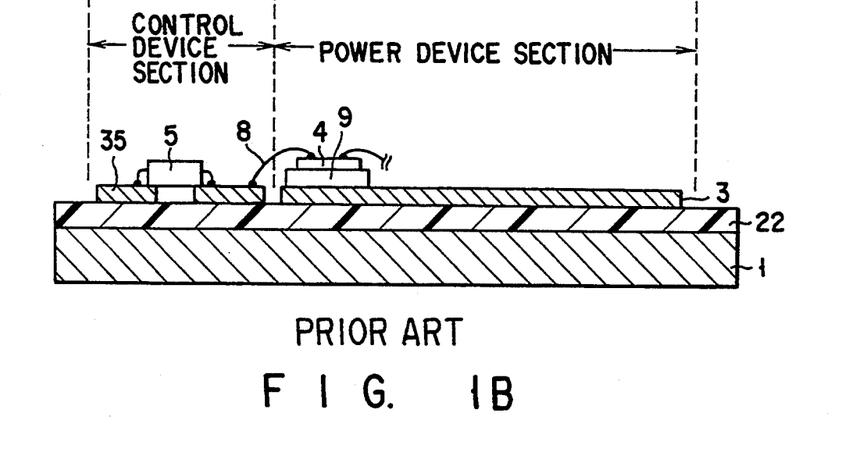
FIG. 1B is a sectional view taken along line 1B—1B of FIG. 1A.
Figure 2:
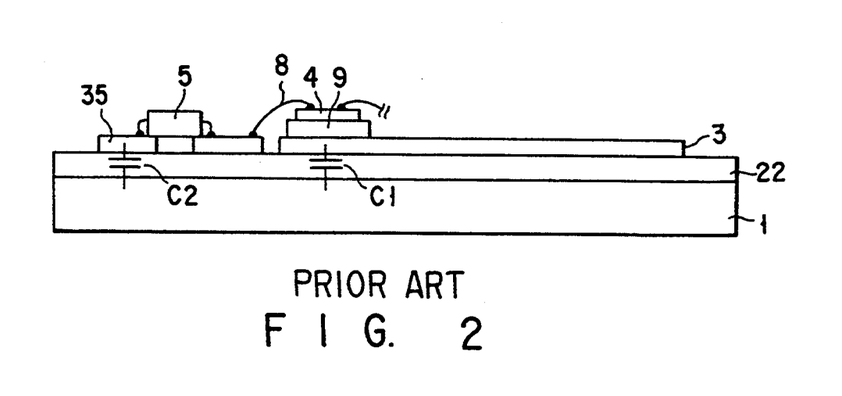
FIG. 2 is a view showing the capacitances parasitic on the module of FIGS. 1A and 1B.

A mounting board used for intelligent power device module is such that wiring (conducting) patterns are formed on an insulating layer of epoxy resin which is formed on a metal base of aluminum. FIG. 1A is a plan view of a conventional intelligent power device module; FIG. 1B is a sectional view taken along line 1B—1B of FIG. 1A; and FIG. 2 is a view showing the capacitances parasitic on the intelligent power device module of FIGS. 1A and 1B.

As shown in FIGS. 1A and 1B, for example, on a metal base 1 of aluminum (Al) is formed an insulating layer 22 of an epoxy-resin thin film, onto which a wiring patterns 3 are attached to complete the mounting board. For example, a power semiconductor device 4 mounted on a heat spreader 9 of copper (Cu), a control circuit device 5, and other elements are put on the mounting board with bonding wires 8 electrically connecting the semiconductor elements including the power semiconductor device chip 4 and control circuit device chip 5 to the wiring patterns 3. The heat spreader 9 is an indispensable part in mounting an element that generates a lot of heat, such as the power semiconductor device 4. In semiconductor power device modules, since the power semiconductor device 4 produces a large amount of heat, the metal base 1 is attached to a heat sink (not shown) before use. To improve the heat-dissipating characteristics of the power semiconductor device, it is desirable that the thickness of the insulating layer 22 of epoxy resin should be as thin as possible. However, to achieve a breakdown voltage of 3 kV to 5 kV which is generally required, the thickness of the insulating layer must be several tens to hundred micrometers. In a semiconductor power device module with such an arrangement, parasitic capacitances C1 and C2 are formed via the insulating layer between the wiring patterns 3 and the metal base 1 as shown in FIG. 2. Because such a capacitance is formed between every block of the wiring patterns 3 and the metal base 1, the capacitances of any two pattern blocks are connected in series. As a result, a capacitive coupling takes place between the power semiconductor device chip 4 and the control circuit device chip 5.

With the large coupling capacitance, when the power semiconductor device chip 4 is caused to switch a high voltage at a high speed, which creates a high dV/dt state, the control circuit will malfunction. The capacitance (C) formed is determined by the wiring pattern area (S), the insulating layer's permittivity ($\epsilon$), and the insulating layer's thickness (d), and is expressed as $C = \epsilon \times S/d$. In the conventional module, because the permittivity ($\epsilon$) of the insulating layer of epoxy resin is not low, and the insulating layer's thickness (d) is thin for heat dissipation of the power semiconductor device, the capacitance formed is relatively large. With a semiconductor of such a construction, therefore, an attempt to switch a high voltage at a high speed permits abrupt changes in the voltage at the power semiconductor device chip 4 to cause differential voltages on the control circuit pattern because the coupling capacitance between the power semiconductor device chip 4 and the control circuit device chip 5. This can cause the control circuit to malfunction.

SUMMARY OF THE INVENTION

The object of the present invention is to provide a semiconductor device module capable of preventing the control device from malfunctioning without degrading the heat-dissipating characteristics of the power device.

To achieve the foregoing object, the present invention comprises: a metal base having a main surface; a metal layer formed on the main surface of the metal base; an insulating substrate formed on the metal layer; conducting film patterns formed on the insulating substrate; a power device electrically connected to the conducting film patterns; a control device, electrically connected to the conducting film patterns, for controlling the power device; and capacitance-reducing means for reducing the capacitance between the control device and the metal base.

With the present invention, the control device is prevented from malfunctioning without degrading the heat-dissipating characteristics of the power device by reducing the capacitance between the control device and the metal base.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring to the accompanying drawings, embodiments of the present invention will be explained. Like parts are shown by corresponding reference characters throughout all drawings, and their repetitive explanation will be avoided.

Figure 3A:
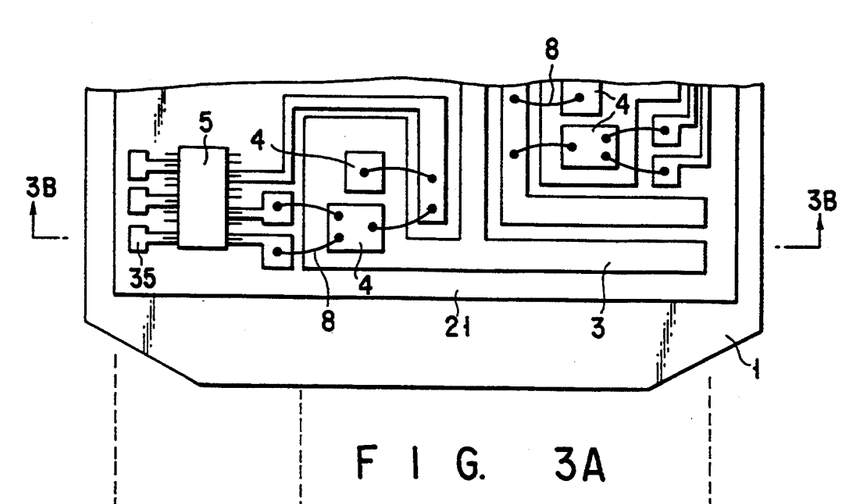
FIG. 3A is a plan view of a semiconductor device module according to a first embodiment of the present invention.
Figure 3B:
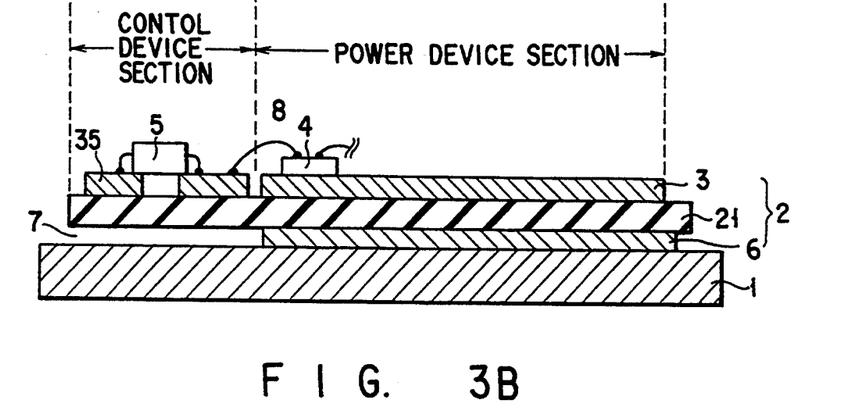
FIG. 3B is a sectional view taken along line 3B—3B of FIG. 3A.

FIG. 3A is a plan view of a semiconductor power device module according to a first embodiment of the present invention; FIG. 3B is a sectional view taken along line 3B—3B of FIG. 3A; and FIG. 4 is a view showing the capacitances parasitic on the module of FIGS. 3A and 3B.

As shown in FIGS. 3A and 3B, a metal base 1 whose thickness is approximately 3 mm is made mainly of, for example, copper (Cu). On the metal base 1 is mounted on a mounting board (substrate) 2. The mounting board 2 is composed of a ceramic board 21 (insulating board) of, for example, alumina nearly 0.635 mm in thickness. On both sides of the alumina board 21 are formed a metal layer 6 of, for example, Cu and a wiring patterns 3 (conducting patterns) of, for example, Cu. The metal layer 6 and wiring patterns 3, 35 both have a thickness of approximately 0.3 mm. The metal layer 6 is jointed to the base metal 1. The wiring patterns 3, 35 on the surface of the mounting board 2 are used for packaging and wiring parts. A power semiconductor device is mounted on the wiring pattern 3. A control circuit semiconductor device is mounted on the wiring patterns 35. The power semiconductor device element is provided in chip 4 form for better heat dissipation. In contrast, the control circuit semiconductor device element is provided in chip 5. Chip 5 use mainly surface-mounting type device (SMD). The control circuit device control the power device. The metal layer 6 at the back of the mounting board 2 is formed for the purpose of fastening the board to the metal base 1 by, for example, soldering. The mounting board 2 has at least part of the metal layer 6 at the back made missing directly under the wiring patterns 35 of the control circuit device section on which the control circuit device chip 5 is to be mounted. Therefore, at that portion, there is a space 7 between the alumina board 21 and the metal base 1. Since the control circuit device generates less heat, there is no problem of heat dissipation even if no metal layer 6 exists below the alumina board 21 under the wiring patterns 35 on which the control circuit device chip 5 is mounted. The metal layer-missing portion at the back of the mounting board 2 is more effective when formed in a portion where the impedance of the control circuit section is high or where the wiring area is large. This is because the high-impedance portion is liable to be affected by capacitive coupling, and the large wiring area has a large coupling capacitance.

Figure 4:
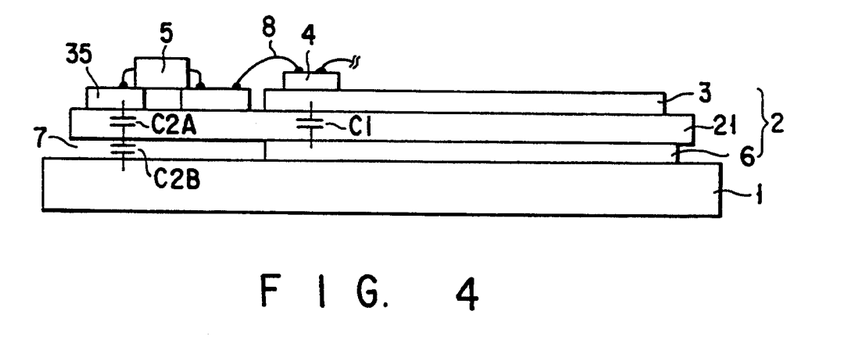
FIG. 4 is a view showing the capacitances parasitic on the module of FIGS. 3A and 3B.

With such an arrangement, as shown in FIG. 4, the coupling capacitance developing at the power semiconductor device chip 4 and wiring patterns 35 of the control circuit device section on which the control circuit device chip 5 is mounted can be reduced remarkably. The reason for this will be explained below. The coupling capacitance C developing at the power semiconductor device section and control circuit semiconductor device section is equal to a series connection of capacitance C1 created between the wiring patterns 3 of the power device section and metal base 1 and capacitance C2 created between the wiring patterns 35 of the control circuit semiconductor device section and metal base 1. Since the wiring pattern area of the portion where the power semiconductor device chip 4 is mounted (the power device section) is generally much larger than a single block of the wiring pattern of the control circuit section, the following expression holds:

$$C1 >> C2 \tag{1}$$

Coupling capacitance obtained by connecting C1 and C2 in series is:

$$C = C1 \times C2/(C1+C2) = C2/(1+C2/C1) \tag{2}$$

Because $C1 >> C2$, equation (2) approximates:

$$C = C2 \tag{3}$$

To decrease coupling capacitance C, therefore, C2 should be decreased. With this arrangement, the existence of space 7 permits C2 to be reduced noticeably, thereby decreasing coupling capacitance C remarkably. How much C2 is reduced with the arrangement of the above embodiment will be described.

If the capacitance created at the ceramic board of alumina is C2A and the capacitance created at space 7 is C2B, because capacitance C2 created between the wiring patterns 35 of the control circuit device section and the metal base 1 is a capacitance obtained by connecting C2A and C2B in series, it is expressed as:

$$C2 = C2A \times C2B/(C2A+C2B) \tag{4}$$

Thus, the ratio of C2 to C2A, capacitance with no clearance, is expressed as:

$$C2/C2A = C2B/(C2A+C2B) \tag{5}$$

Here, if the area of the wiring pattern of the control circuit section concerned is S, because the relative permittivity of alumina is 8.5, the thickness of the alumina board is 0.635 mm, and $C = \epsilon \times S/d$ as noted earlier, capacitance C2A created at the alumina board is expressed as:

$$C2A = 8.5 \times \epsilon_0 \times S/(0.635 \times 10^{-3}) \quad (6)$$

where $\epsilon_0$ the electric constant. On the other hand, because the relative permittivity of air is 1.0 and the thickness of space 7 is 0.3 mm, capacitance C2B formed at the clearance between the alumina board and the metal base is expressed as:

$$C2B = 1.0 \times \epsilon_0 \times S/(0.3 \times 10^{-3}) \quad (7)$$

Putting equations (6) and (7) into equation (5) gives:

$$C2/C2A = 0.20 \quad (8)$$

As seen from this equation, the existence of the space reduces the coupling capacitance to one-fifth that with no space.

Figure 5A:
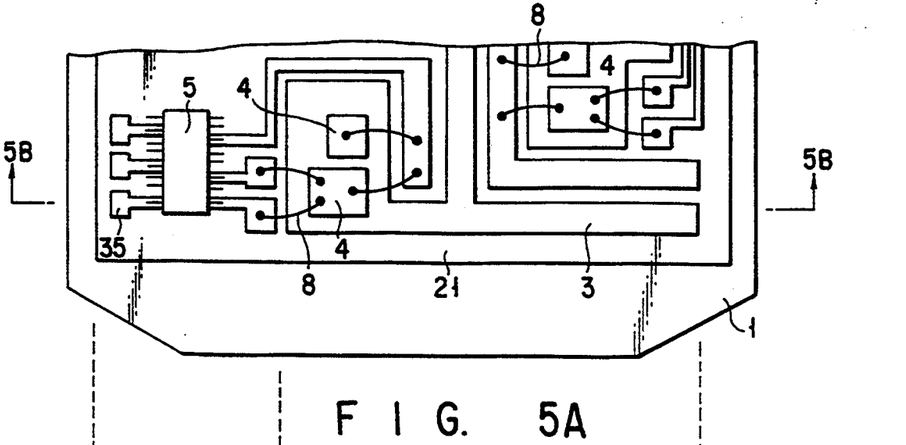
FIG. 5A is a plan view of a semiconductor device module according to a second embodiment of the present invention.
Figure 5B:
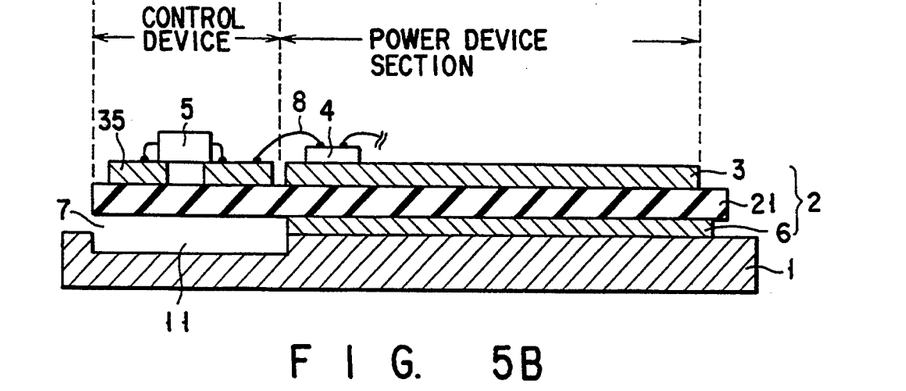
FIG. 5B is a sectional view taken along line 5B—5B of FIG. 5A.
Figure 6:
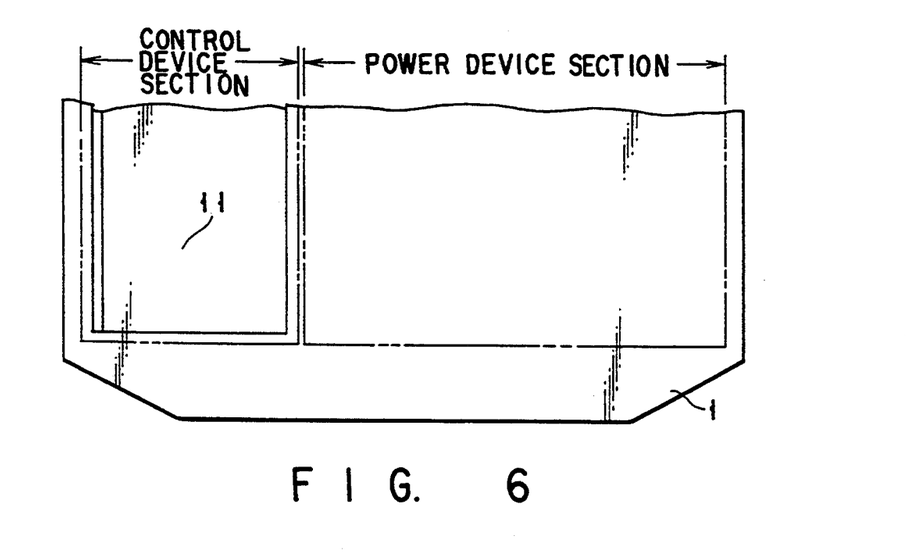
FIG. 6 is a plan view of the metal base of the module of FIGS. 5A and 5B.

FIG. 5A is a plan view of a semiconductor device module according to a second embodiment of the present invention; FIG. 5B is a sectional view taken along line 5B—5B of FIG. 5A; and FIG. 6 is a plan view of the metal base of the module shown in FIGS. 5A and 5B.

As shown in FIGS. 5A and 5B, the module of the second embodiment is composed of a metal base 1 of Cu approximately 3 mm in thickness, a mounting board 2 jointed to the metal base 1, semiconductor elements including a power semiconductor device chip 4 and a control circuit device chip 5 mounted on the mounting board 2. The mounting board 2 uses an alumina board 21 of 0.635 mm in thickness as an insulating board, on both sides of which are formed a metal layer 6 of Cu nearly 0.3 mm thick to be in contact with the metal base 1 and a wiring patterns 3, 35 of Cu nearly 0.3 mm thick to be mounted with semiconductor elements. The wiring patterns 3, 35 are used for packaging and wiring parts. The mounting board 2 has part of the metal layer made missing directly under the wiring patterns 35 of the control circuit device section on which the control circuit device is to be mounted. In addition, a cut of 1 to 2 mm deep is made on the metal base 1 below the metal layer-missing portion to form a groove 11.

Thus, there is a space 7 wider than that of the previous embodiment between the alumina board 21 and the metal base 1 at that portion. Since the elements of the control circuit device generate less heat, there is no problem of heat dissipation even if the space 7 exists below the alumina board 1 under the wiring patterns 35. The groove 11 in the metal base 1 is far more effective when formed in a portion where the impedance of the control circuit device section is high or where the wiring area is large.

With this arrangement, the coupling capacitance at the power semiconductor device and the wiring patterns 35 of the control circuit device section can be decreased remarkably for the same reason as the first embodiment. In the present embodiment, if the depth of the cut is 1.0 mm, this will increase the thickness of the clearance to 1.3 mm. By the same calculation as in the first embodiment, the coupling capacitance can be decreased to one-eighteenth that with no clearance.

Figure 7A:
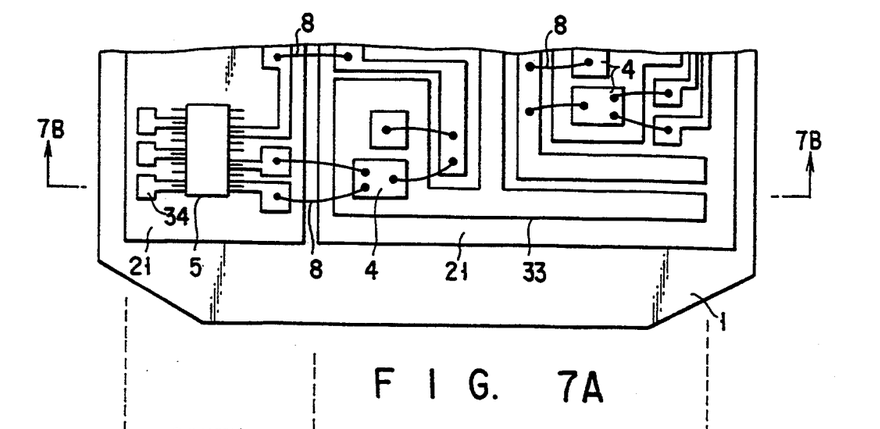
FIG. 7A is a plan view of a semiconductor device module according to a third embodiment of the present invention.
Figure 7B:
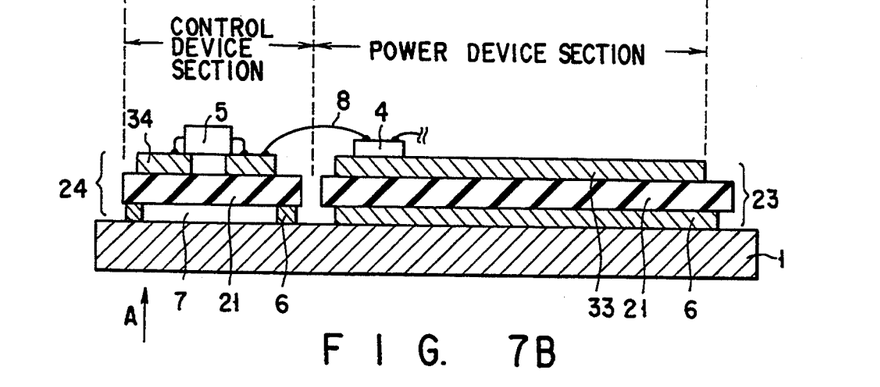
FIG. 7B is a sectional view taken along line 7B—7B of FIG. 7A.
Figure 8A:
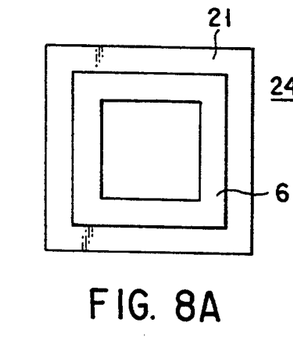
FIGS. 8A to 8C are plan views of modifications of the metal layer of the module shown in FIGS. 7A and 7B.
Figure 8B:
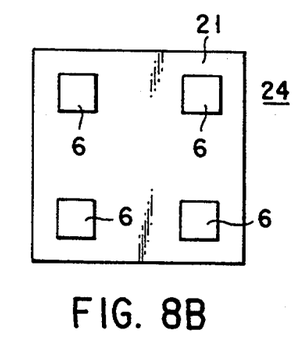
Figure 8C:
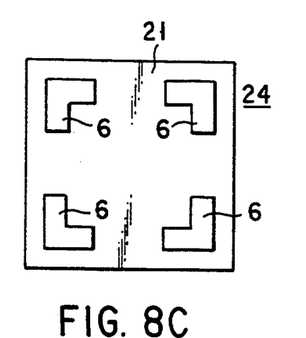

FIG. 7A is a plan view of a semiconductor device module according to a third embodiment of the present invention; FIG. 7B is a sectional view taken along line 7B—7B of FIG. 7A; and FIGS. 8A to 8C are plan views of modifications of the metal layer of the module shown in FIGS. 7A and 7B.

In the first and second embodiments, the power device section and the control circuit device section are formed on a single ceramic insulating board serving as a mounting board. If they are formed on a single metal base, the mounting board may be divided into a plurality of insulating boards. In this case, each mounting board may be used for the power semiconductor device or the control circuit device for exclusive use. Those devices may be put on a single board. The number of divided boards is not limited. Electrical connections between the wiring patterns of those boards can be made by bonding wires 8, for example. In this embodiment, two packaging boards, the power semiconductor device chip 4 mounting board 23 and control circuit device chip 5 mounting board 24, are placed on the metal base 1 with their wiring patterns electrically connected to each other by bonding wires 8. The power semiconductor device mounting board 23 has the metal layer 6 formed almost all over the back of the wiring pattern 33, whereas the control circuit device mounting board 24 has almost no metal layer 6 formed on its back. In the portion where the metal layer 6 is not formed under the wiring pattern 34 of the control circuit device section, a space 7 exists. As noted earlier, the metal layer 6 is necessary for securing the mounting board to the metal base by, for example, soldering. Even when more than one mounting board is used as in this embodiment, the metal base must be attached to each board. Since the control circuit device mounting board 24 must be provided with the space 7, special care should be taken in determining the shape and arrangement of the metal layer. FIGS. 8A to 8C, which are plan views of the metal layer 6 seen in the direction of arrow A in FIG. 7B, show some examples, which is illustrative and to which the present invention is not restricted.

Figure 9A:
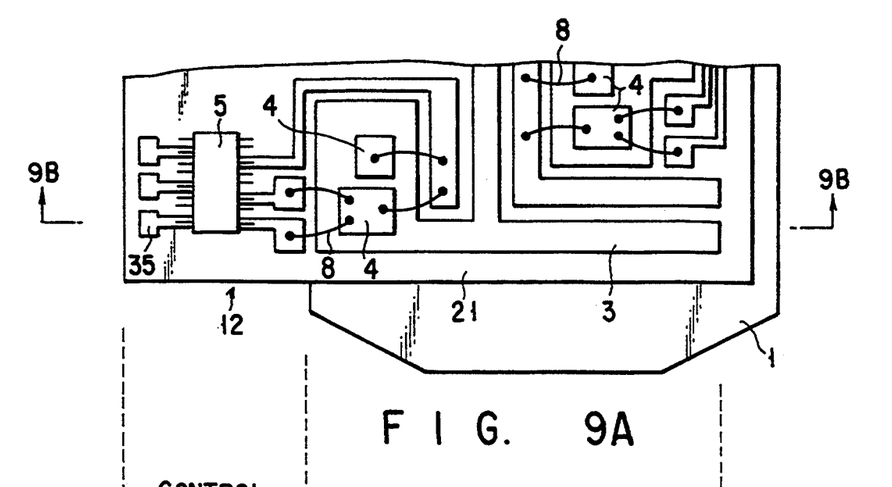
FIG. 9A is a plan view of a semiconductor device module according to a fourth embodiment of the present invention.
Figure 9B:
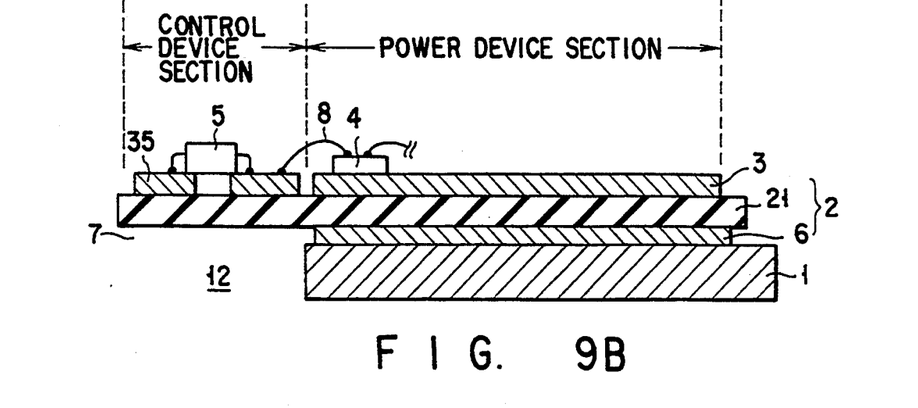
FIG. 9B is a sectional view taken along line 9B—9B of FIG. 9A.
Figure 10:
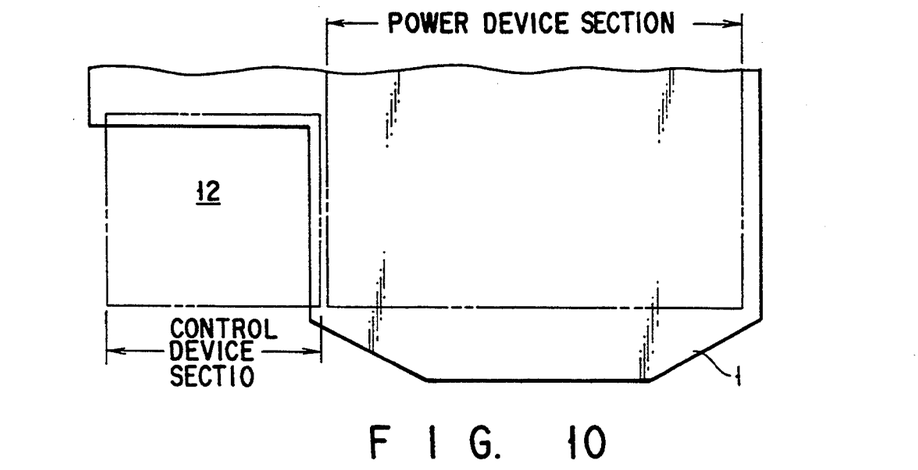
FIG. 10 is a plan view of the metal base of the module of FIGS. 9A and 9B.

FIG. 9A is a plan view of a semiconductor device module according to a fourth embodiment of the present invention; FIG. 9B is a sectional view taken along line 9B—9B of FIG. 9A; and FIG. 10 is a plan view of the metal base of the module shown in FIGS. 9A and 9B.

While in the third embodiment, more than one mounting board is used, the construction of the metal base is improved in the fourth embodiment. As shown in FIG. 1, the module of this embodiment is composed of a metal base 1 of Cu approximately 3 mm in thickness, a mounting board 2 jointed to the metal base 1, a power semiconductor device chip 4 is mounted on the wiring layer 3, and a control circuit semiconductor device chip 5 is mounted on the wiring layer 35. The mounting board 2 uses an alumina board 21 of 0.635 mm in thickness as an insulating board, on both sides of which are formed a metal layer 6 of Cu nearly 0.3 mm thick to be in contact with the metal base 1 and a wiring patterns 3, 35 of Cu nearly 0.3 mm thick to be mounted with semiconductor elements. The wiring patterns 3, 35 are used for packaging and wiring parts. The mounting board 2 has part of the metal layer made missing directly under the wiring patterns 35 of the control circuit device section on which the control circuit device chip 5 is to be mounted.

This configuration is characterized in that to form the space 7 under the control circuit section of the mounting board, not only part of the base layer 6 of the mounting board 2 is cut but also part of the metal base at the portion where a space is to be formed is cut off to form a cutaway portion 12. In the semiconductor device module of FIG. 2, the metal base has the groove 11 formed in the place where a clearance is created, to reduce the coupling capacitance there. In the present embodiment, however, the metal base is removed where a clearance is formed, to form the cutaway portion 12. This configuration reduces the coupling capacitance more and makes work easier than the grooved metal base. Since the elements of the control circuit device section generate less heat, there is no problem even if no base metal exists under the board. The portion where no metal base exists is more effective when formed in a portion where the impedance of the control circuit device section is high or where the wiring area is large. With this configuration, almost no coupling capacitance series-connected by the metal base exists between the control circuit wiring pattern and the metal base at that portion, thereby almost nullifying the coupling capacitance at the power semiconductor device and the wiring pattern of the control circuit section. In this configuration, however, because part of the mounting board is out of contact with the metal base, special care must be taken not to expose the mounting board outside the semiconductor device module in the final packaging process.

Figure 11A:
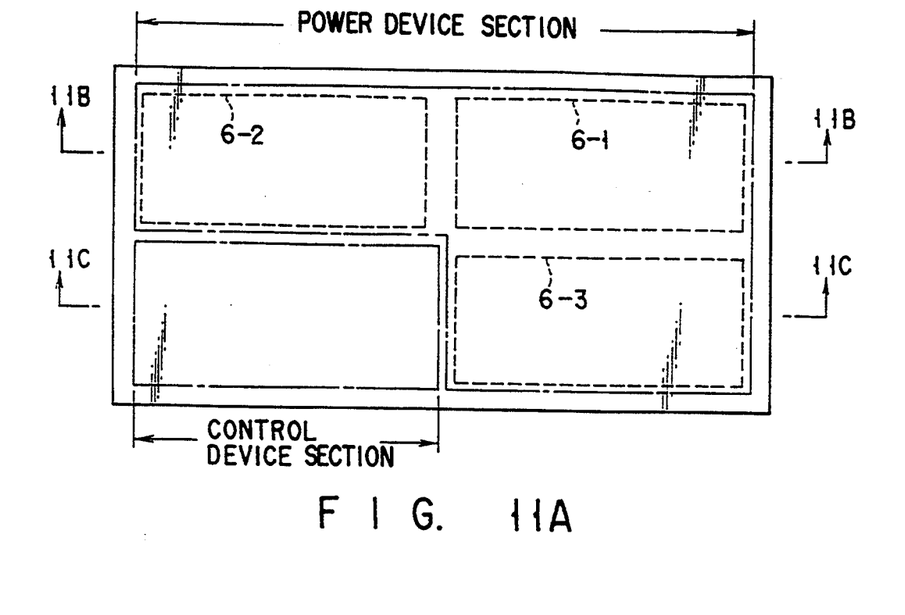
FIG. 11A is a plan view of a semiconductor device module according to a fifth embodiment of the present invention.
Figure 11B:
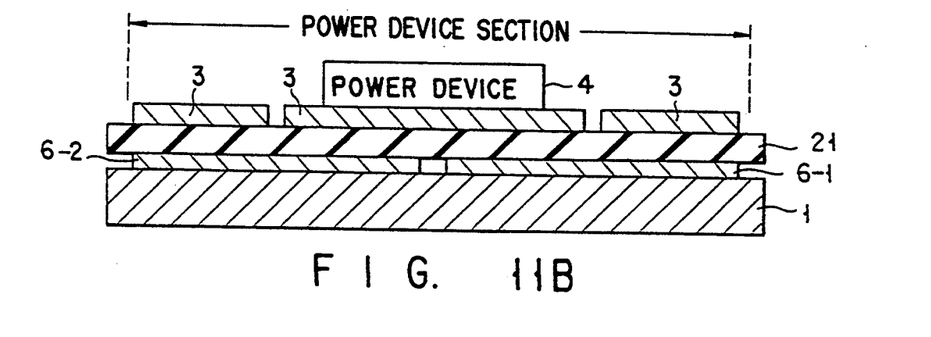
FIG. 11B is a sectional view taken along line 11B—11B of FIG. 11A.

FIG. 11A is a plan view of a semiconductor device module according to a fifth embodiment of the present invention; FIG. 11B is a sectional view taken along line 11B—11B of FIG. 11A; and FIG. 11C is a sectional view taken along line 11C—11C of FIG. 11A.

Figure 11C:
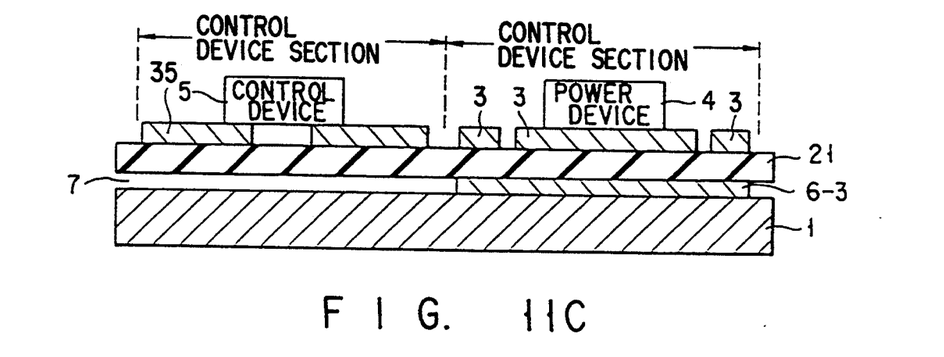
FIG. 11C is a sectional view taken along line 11C—11C of FIG. 11A.

As shown in FIGS. 11A to 11C, on a main surface of a ceramic board 21 constituting a mounting board, a metal layer 6 is formed for attaching to the metal base 1. In the first to fourth embodiments, the metal layer 6 is formed one for each mounting board. Since the ceramic board has a different thermal coefficient from that of the metal layer, when the metal layer is formed over the entire surface of the board, there is a possibility that the board or the metal layer is damaged due to a change in the environment. To alleviate thermal stress, the metal layer is divided into a plurality of portions as shown in FIGS. 11A to 11C. Specifically, one of the divided metal layers (four layers in this case) is removed for the control circuit section, under which a space is to be provided. The whole divided metal layer is not necessarily removed, but as much part of the divided metal layer as accommodates the control circuit section may be removed. The metal layer may be divided into as many portions as needed. The shape of divided layers is not restricted to a square, but may be a circle and an ellipse. They may be irregular in shape.

Figure 12:
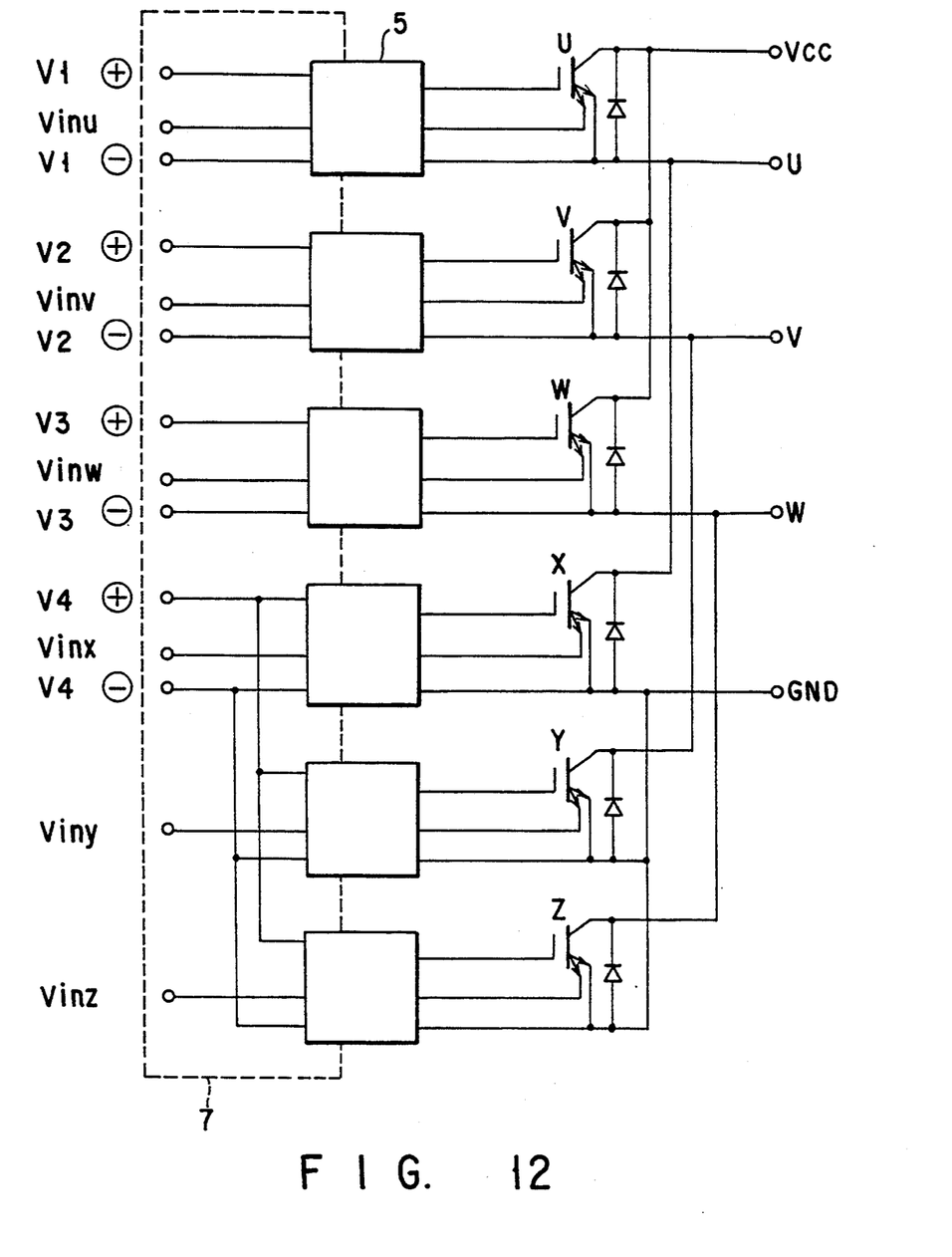
FIG. 12 is a typical circuit diagram of a semiconductor device module according to the present invention.
Figure 13:
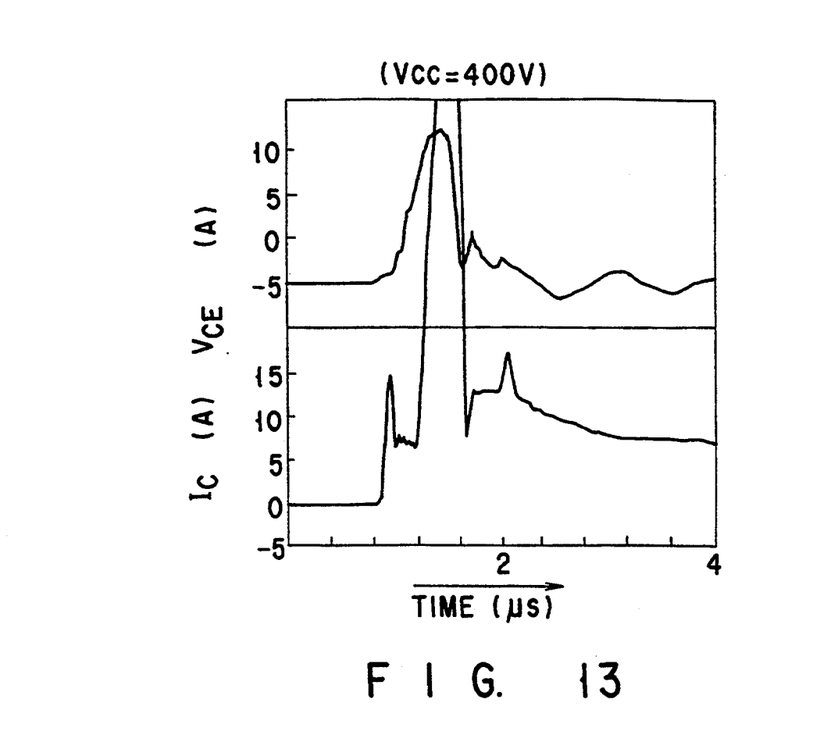
FIG. 13 is a diagram showing the relationship between current and time and the relationship between voltage and time in a conventional semiconductor device module.
Figure 14:
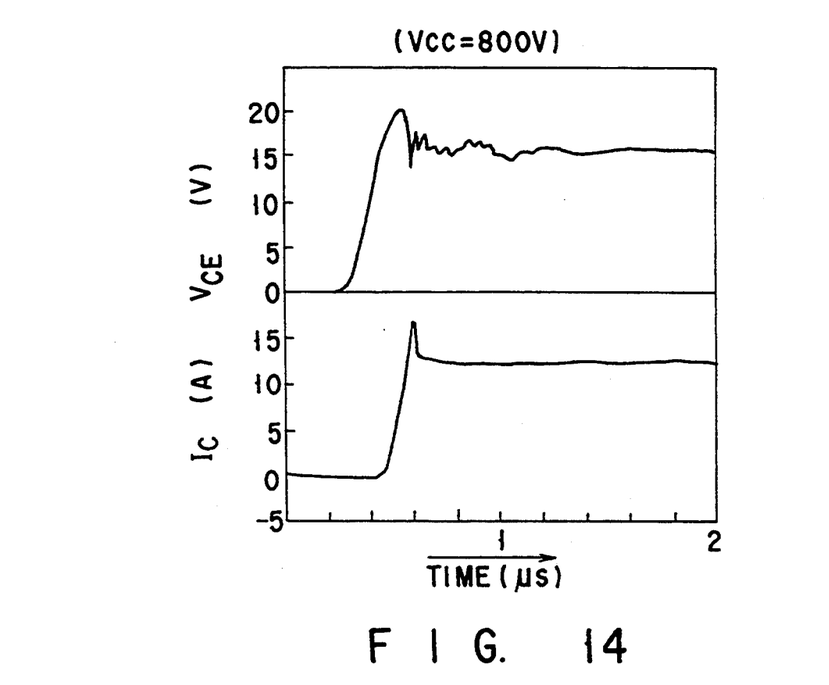
FIG. 14 is a diagram showing the relationship between current and time and the relationship between voltage and time in a semiconductor device module according to the present invention.

There are no particular restrictions on power circuits applicable to the present invention. As an example, referring to FIG. 12 where an inverter circuit is put on the packaging board, the effect of the present invention will be explained. In this circuit, an IGBT (Insulated Gate Bipolar Transistor) is used as a power semiconductor device, and its driving circuit and overcurrent detector are contained in the control circuit device section. The results of circuit operating tests carried out using a packaging board of the present invention and a conventional one are shown in FIGS. 13 and 14. FIGS. 13 and 14 illustrate the current waveform flowing through the +vcc line and the gate voltage waveform of IGBT at the time when IGBT is turned on. In the test, check was made to see if IGBT would be turned on properly, by raising vcc from 0 V to 800 V while applying the input pulse to a single phase (for example, Z phase). With the semiconductor device module using a conventional mounting board, when Vcc had reached approximately 400 V, the control circuit malfunctioned, which permitted IGBT to short-circuit Vcc to the GND, leading to overcurrent (FIG. 13). Properly, only the IGBT of Z phase must turn on and overcurrent due to a short circuit cannot be allowed to flow. A rapid voltage change at the time when the Z-phase output stage was turned on, however, caused a differential voltage at the control circuit section of another phase through the capacitive coupling between the output stage and the control circuit section, which made the control circuit malfunction. In consequence, the IGBTs of any upper and lower phase combination of U phase and X phase, V phase and Y phase, and W phase and Z phase were both turned on, which permitted short-circuit current to flow. The reason why the short-circuit current decreased after a certain period of time in FIG. 13, is that the overcurrent-protective function of the control circuit operated to reduce the gate voltage of the IGBT.

On the other hand, with the semiconductor device module of the present invention, even when Vcc had reached 800 V, the control IC did not malfunction but turned on properly (FIG. 14). Here, the portion where the clearance 7 was provided between the ceramic board and the metal base was located at the input portion of the control circuit (the portion enclosed by doted lines in FIG. 12), which had a high impedance and was liable to be affected by the capacitive coupling.

Semiconductor materials used for semiconductor device modules of the present invention are not limited to some of the existing materials such as Si, Ge, or GaAs, but may include any other materials. The metal base is not restricted to Cu, but may be made of other metals such as Al or Fe. In addition to alumina, the ceramic board may be composed of mechanically tough material or good thermal conductivity material, such as AlN or beryllia. It is desirable that the wiring pattern and metal layer formed on the ceramic board should be made of metals such as Cu or Mo, whose thermal coefficient are close to those of the ceramic board and metal base. The semiconductor device module of the present invention has wide application including inverter air-conditioners, general-purpose inverters, AC servos, non-power-failure power supplies.

As described so far, with the present invention, it is possible to provide a semiconductor device module whose control circuit is less liable to malfunction even when the power semiconductor device is caused to switch a high voltage at a high speed, or to perform a high dV/dt operation, because the coupling capacitance at the power semiconductor device and the control circuit can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device module comprising:
   an electrically conductive base having a main surface;
   an electrically insulative substrate provided on said main surface of said base;
   electric wiring patterns formed on said substrate;
   a power device electrically connected to said electric wiring patterns;
   a control device electrically connected to said electric wiring patterns, for controlling said power device; and
   capacitance-reducing means for reducing a capacitance between said control device and said base;
   wherein said control device and base constitute a first coupling capacitor having a first dielectric layer which has a first dielectric constant and a second capacitor having a second dielectric layer which has a second dielectric constant, and said capacitance-reducing means includes said first dielectric constant being less than said second dielectric constant to reduce the capacitance between said control device and said base.

2. A semiconductor device module according to claim 1, wherein said capacitance-reducing means makes said first dielectric layer thicker than said second dielectric layer, to reduce the capacitance between said control device-means and said base.

3. A semiconductor device module according to claim 2, wherein said first dielectric layer comprises part of said substrate and a space, and said second dielectric layer comprises another part of said substrate.

4. A semiconductor device module according to claim 3, further comprising:
   a bonding layer for bonding said substrate to said base.

5. A semiconductor device module according to claim 4, wherein said bonding layer is electrically conductive.

6. A semiconductor device module according to claim 5, wherein said bonding layer is provided between said substrate and said base under a portion where said power device is formed.

7. A semiconductor device module according to claim 6, wherein said substrate comprises a ceramic board.

8. A semiconductor device module according to claim 7, wherein said ceramic board is formed of one of alumina, aluminum nitride and beryllia.

9. A semiconductor device module according to claim 1, wherein said electric wiring patterns comprise electrically conductive films.

10. A semiconductor device module according to claim 9, wherein said electrically conductive films are formed of copper.

11. A semiconductor device module according to claim 1, wherein said base is formed of metal and is electrically and thermally conductive.

12. A semiconductor device module according to claim 1, wherein said power device comprises a plurality of semiconductor chips and said control device comprises a semiconductor chip.

13. A semiconductor device module according to claim 3, wherein said space is filled with gas.

14. A semiconductor device module according to claim 13, wherein said gas is air.

15. A semiconductor device module according to claim 5, wherein said bonding layer is formed of an electrically and thermally conductive metal.

16. A semiconductor device module according to claim 15, wherein said metal is copper.

17. A semiconductor device module according to claim 16, wherein said bonding layer is divided into a plurality of portions, and provided between said insulating substrate and said metal base.

18. A semiconductor device module according to claim 16, wherein said base has a recessed portion under said control device.

19. A semiconductor device module according to claim 16, wherein said base has a cutaway portion in it under said control device.

* * * * *